(12) United States Patent
Udagawa et al.

(10) Patent No.: US 12,156,388 B2
(45) Date of Patent: Nov. 26, 2024

(54) POWER CONVERTER

(71) Applicant: TMEIC Corporation, Chuo-ku (JP)

(72) Inventors: Ikuto Udagawa, Chuo-ku (JP);
Shigeyuki Nakabayashi, Chuo-ku (JP);
Tomoaki Tanabe, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 301 days.

(21) Appl. No.: 17/624,955

(22) PCT Filed: Apr. 10, 2020

(86) PCT No.: PCT/JP2020/016098
§ 371 (c)(1),
(2) Date: Jan. 5, 2022

(87) PCT Pub. No.: WO2021/205641
PCT Pub. Date: Oct. 14, 2021

(65) Prior Publication Data
US 2022/0295673 A1    Sep. 15, 2022

(51) Int. Cl.
*H05K 7/20* (2006.01)
*H02M 7/00* (2006.01)

(52) U.S. Cl.
CPC ........ *H05K 7/20927* (2013.01); *H02M 7/003* (2013.01); *H05K 7/20272* (2013.01)

(58) Field of Classification Search
CPC .......... H05K 7/20927; H05K 7/20272; H05K 7/20327; H05K 7/2089; H05K 7/20845; H05K 7/20872
See application file for complete search history.

(56) References Cited

U.S. PATENT DOCUMENTS 8,456,833 B2 * 6/2013 Eagle ................. H05K 7/20781
361/699
9,769,955 B2 * 9/2017 Teraki ................... H01L 23/473
(Continued)

FOREIGN PATENT DOCUMENTS

JP      2006-32515 A      2/2006

OTHER PUBLICATIONS

International Search Report mailed on Jun. 16, 2020 in PCT/JP2020/016098 filed on Apr. 10, 2020 (3 pages).

*Primary Examiner* — Jacob R Crum
*Assistant Examiner* — Matthew Sinclair Muir
(74) *Attorney, Agent, or Firm* — Oblon, McClelland, Maier & Neustadt, L.L.P.

(57) ABSTRACT

A power converter includes a power conversion module including a heat generation device, a cooling medium path through which a cooling medium for cooling the heat generation device flows, and a cooling medium collection unit disposed facing the power conversion module and collecting the cooling medium that has cooled the heat generation device. The power conversion module includes a first heat conductive member in which a first flow path forming a part of a cooling medium path is provided. The cooling medium path includes a first connecting pipe connecting a first flow path provided in the first heat conductive member with the cooling medium collection unit. The power converter further includes a first support tool provided in at least one of the cooling medium collection unit and the power conversion module and supporting the first connecting pipe.

3 Claims, 4 Drawing Sheets

(56) References Cited

U.S. PATENT DOCUMENTS

| | | | |
|---|---|---|---|
| 10,015,906 B1* | 7/2018 | Somerville | H05K 7/20927 |
| 2020/0281094 A1* | 9/2020 | Davis | G06F 1/20 |
| 2022/0346272 A1* | 10/2022 | Nakabayashi | H02M 7/003 |
| 2022/0408595 A1* | 12/2022 | Isoya | H01L 23/473 |

* cited by examiner

POWER CONVERTER

TECHNICAL FIELD

The present disclosure relates to power converters.

BACKGROUND ART

A conventional power converter including a plurality of power conversion modules employs a water cooling system of flowing cooling water through pipes in order to cool a power device, such as a thyristor device, which is used in a main circuit of a converter or an inverter.

In the power converter disclosed in Japanese Patent Laying-Open No. 2006-32515 (PTL 1), pipes are routed so as to pass through a housing in which a power device is housed, and as refrigerant such as cooling water flows through the pipes, the power device is cooled.

CITATION LIST

Patent Literature

PTL 1: Japanese Patent Laying-Open No. 2006-32515

SUMMARY OF INVENTION

Technical Problem

When pipes are routed as described in PTL 1, a portion of the pipe is routed to an appreciable extent. When refrigerant flows through such a portion, the refrigerant causes the pipe to vibrate. If the pipe cracks due to such vibrations, the refrigerant may leak out of the pipe.

The present disclosure has been made in view of the above problem, and an object of the present disclosure is to provide a power converter capable of reducing damage to a cooling medium flow path.

Solution to Problem

A power converter according to the present disclosure includes a power conversion module including at least one heat generation device, a cooling medium path through which a cooling medium for cooling the at least one heat generation device flows, and a cooling medium collection unit disposed facing the power conversion module and collecting the cooling medium that has cooled the at least one heat generation device. The power conversion module includes a first heat conductive member in which a first flow path forming a part of the cooling medium path is provided. The cooling medium path includes a first connecting pipe connecting the first flow path provided in the first heat conductive member with the cooling medium collection unit. The power converter further incudes a first support tool provided in at least one of the cooling medium collection unit and the power conversion module and supporting the first connecting pipe.

In the power converter according to the present disclosure, the first support tool may be provided in the power conversion module. In this case, preferably, the power conversion module includes a holding member holding the first heat conductive member, and the first support tool is fixed to the holding member so as to retain the holding member therein.

In the power converter according to the present disclosure, the first heat conductive member may extend in a first direction in which the power conversion module and the cooling medium collection unit are provided side by side and have a first end on a first side in the first direction on which the cooling medium collection unit is located. The holding member may extend in a second direction intersecting the first direction. Further, the first connecting pipe may be routed to extend from a first end side toward the cooling medium collection unit. The first support tool may include a retaining portion retaining the holding member therein from outside the first heat conductive member in the second direction, a support portion supporting the first connecting pipe on a side on which the cooling medium collection unit is located relative to the retaining portion, and a connecting portion connecting the support portion with the retaining portion. In this case, the connecting portion preferably has an inclined portion inclined to approach the cooling medium collection unit in the first direction as the inclined portion approaches a first heat conductive member side in the second direction.

In the power converter according to the present disclosure, the power conversion module may further include a second heat conductive member in which a second flow path forming a part of the cooling medium path is provided, and a unit in which a third flow path forming a part of the cooling medium path is provided. The second heat conductive member may be held by the holding member so as to intersect the holding member and may have a first end located on a side on which the cooling medium collection unit is located relative to the holding member, and a second end located opposite to the side on which the cooling medium collection unit is located relative to the holding member. The unit may be fixed to the second heat conductive member to be located on a second end side of the second heat conductive member relative to the holding member. In this case, the cooling medium path preferably includes a second connecting pipe connecting the second flow path with the third flow path. The second connecting pipe preferably connects the unit with a first end side of the second heat conductive member so as to cross the holding member, and the cooling medium path preferably connects the unit with a first end side of the second heat conductive member so as to cross the holding member. In this case, preferably, the power converter further includes a second support tool fixed to the holding member so as to retain the holding member therein and supporting the second connecting pipe.

In the power converter according to the present disclosure, the second support tool may have a first rod-shaped portion and a second rod-shaped portion retaining the holding member therebetween from the first end side and the second end side of the second heat conductive member. In this case, the second connecting pipe is preferably supported by at least one of the first rod-shaped portion and the second rod-shaped portion.

Advantageous Effects of Invention

The present disclosure can provide a power converter capable of reducing damage to a cooling medium flow path.

DESCRIPTION OF EMBODIMENTS

Figure 1:
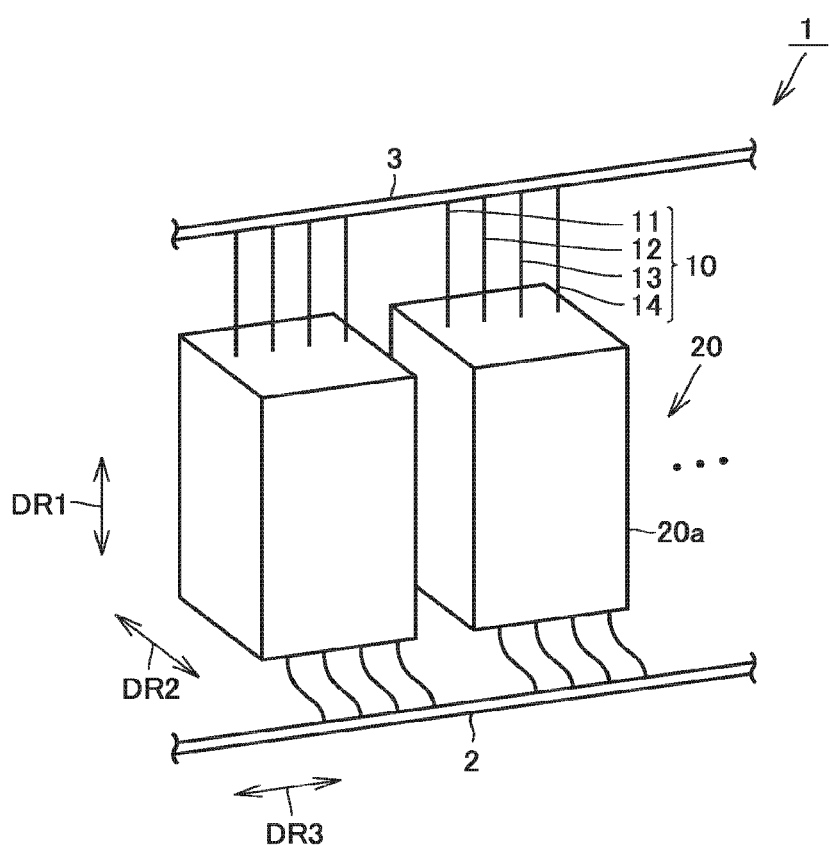
FIG. 1 is a schematic perspective view of a power converter according to Embodiment 1.

Embodiments of the present disclosure will be described below in detail with reference to the drawings. It should be noted that in the following embodiments, the same or corresponding parts are denoted by the same reference numerals, and the description thereof will not be repeated.

In the figures, a DR1 direction is an up-down direction, a DR2 direction is a front-rear direction orthogonal to the up-down direction, and a DR3 direction is a left-right direction orthogonal to the up-down direction and the front-rear direction.

Embodiment 1

Figure 2:
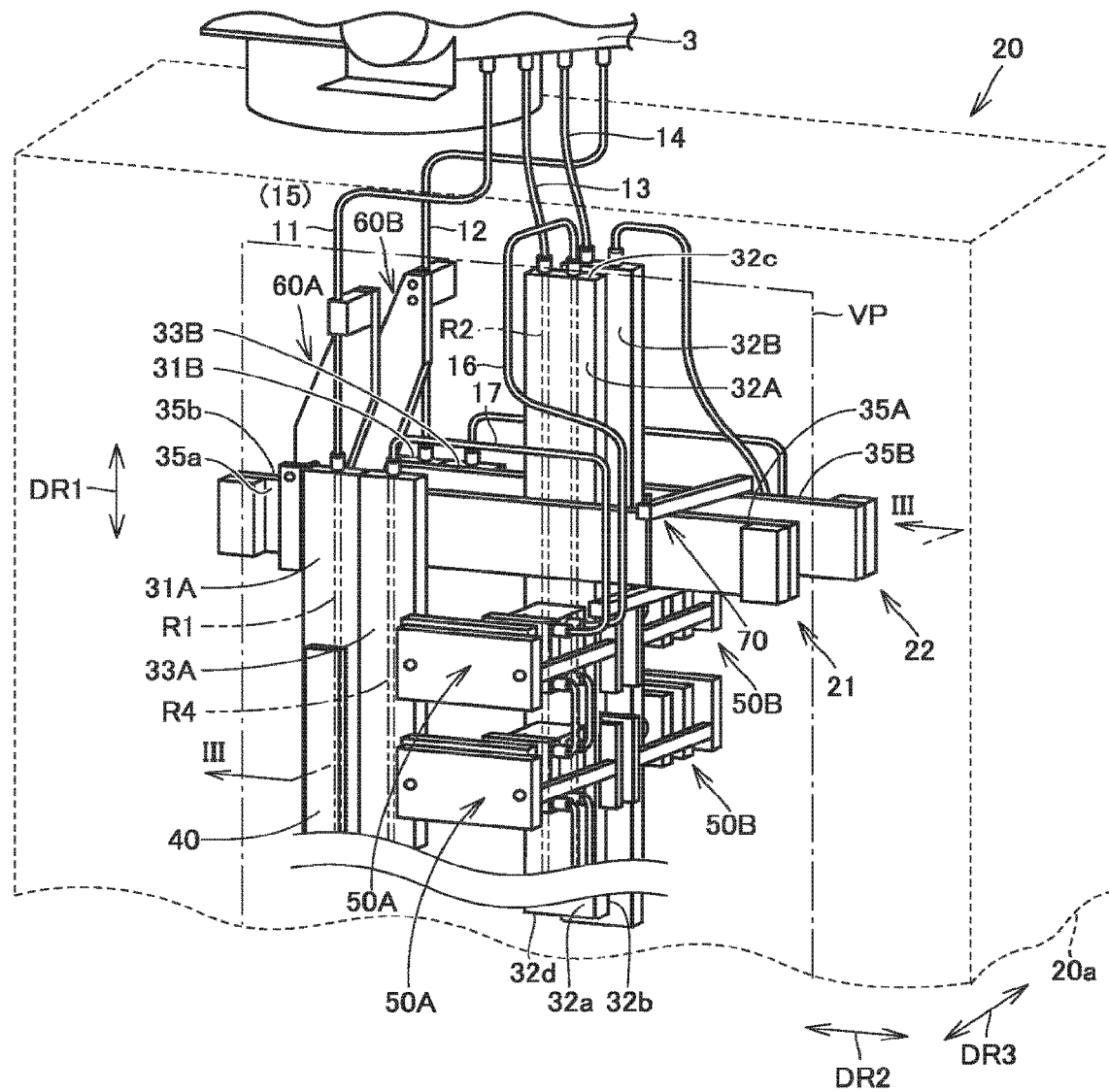
FIG. 2 is a schematic perspective view showing an internal configuration of a power conversion module and a cooling medium collection unit according to Embodiment 1.
Figure 3:
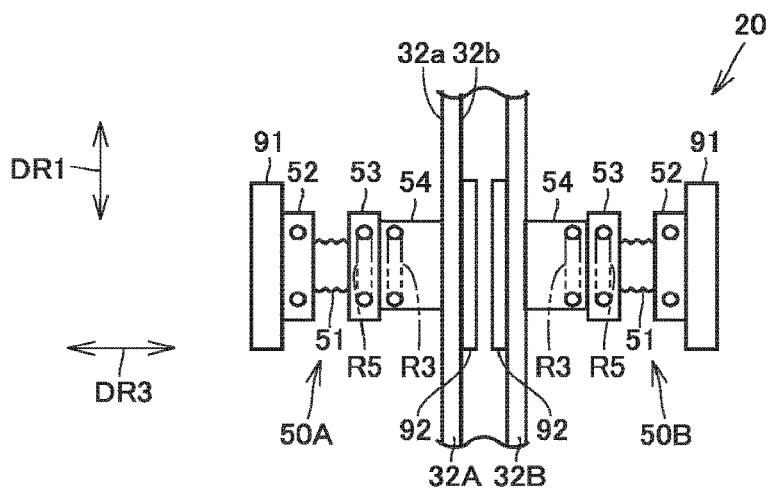
FIG. 3 is a sectional view taken along the line III-III shown in FIG. 2.

FIG. 1 is a schematic perspective view of a power converter according to Embodiment 1. FIG. 2 is a schematic perspective view showing an internal configuration of a power conversion module and a cooling medium collection unit according to Embodiment 1. FIG. 3 is a sectional view taken along the line III-III shown in FIG. 2. A power converter 1 according to Embodiment 1 will be described with reference to FIG. 1.

As shown in FIG. 1, power converter 1 includes a plurality of power conversion modules 20, a cooling medium supply pipe 2 serving as a cooling medium supply unit for supplying a cooling medium to power conversion modules 20, a cooling medium collection pipe 3 serving as a cooling medium collection unit that collects the cooling medium discharged from power conversion modules 20, and a cooling medium path 10.

Cooling medium supply pipe 2 and cooling medium collection pipe 3 are disposed outside power conversion modules 20. Specifically, cooling medium supply pipe 2 is located to be forward of power conversion modules 20 and below power conversion modules 20. Cooling medium collection pipe 3 is located to be reward of power conversion modules 20 and above power conversion modules 20.

Cooling medium path 10 is provided so as to pass through a housing 20a of power conversion module 20 and connects cooling medium supply pipe 2 with cooling medium collection pipe 3. Cooling medium path 10 includes, for example, four paths 11, 12, 13, and 14. As a cooling medium such as cooling water flows through cooling medium path 10, a heat generation device housed inside housing 20a, which will be descried below, is cooled.

As shown in FIG. 2, power conversion module 20 includes a first unit 21, a second unit 22, a plurality of first support tools 60A and 60B, and a second support tool 70. First unit 21 and second unit 22 form a main circuit portion of the power conversion module.

First unit 21 includes a plurality of heat conductive members 31A to 33A, a holding member 35A, a first heat generation device 40, and a plurality of units 50A serving as a second heat generation device.

Second unit 22 includes a plurality of heat conductive members 31B to 33B, a holding member 35B, a first heat generation device (not shown), and a plurality of units 50B serving as a second heat generation device. Second unit 22 is disposed symmetrical to first unit 21 about a virtual plane VP parallel to the DR1 direction and the DR2 direction.

Second unit 22 has a configuration substantially similar to that of first unit 21. Thus, a detailed configuration of first unit 21 will be described, and the description on second unit 22 will be omitted.

Heat conductive members 31A to 33A each have a plate shape. Heat conductive members 31A to 33A extend in the direction in which power conversion modules 20 and cooling medium collection pipe 3 are provided side by side. More specifically, heat conductive members 31A to 33A extend in the DR1 direction.

Heat conductive members 31A to 33A are disposed side by side in the DR2 direction. Heat conductive member 31A (first heat conductive member) and heat conductive member 33A are arranged adjacent to each other in the DR2 direction. Heat conductive member 32A is disposed apart from heat conductive member 33A on a first side (front side) in the DR2 direction. Heat conductive members 31A to 33A are held by holding member 35A.

Holding member 35A extends in the direction intersecting the direction in which power conversion modules 20 and cooling medium collection pipe 3 are provided side by side. Specifically, holding member 35A extends in the DR2 direction. Holding member 35A has a plate shape. Holding member 35A has a first surface 35a and a second surface 35b, which are the front and rear in the DR3 direction.

Heat conductive members 31A and 33A each have a first end on a first side (upper side) in the DR1 direction, and the first end side is fixed to holding member 35A. Specifically, heat conductive members 31A and 33A are each fixed to first surface 35a of holding member 35A by a fastening member or the like.

First heat generation device 40 is installed in heat conductive member 31A (first heat conductive member). First heat generation device 40 includes, for example, any of a semiconductor device, a resistor, a reactor, a circuit board, and the like. A first flow path R1, through which a cooling medium flows, is provided in heat conductive member 31A.

First flow path R1 forms a part of cooling medium path 10 (more specifically, path 11). First flow path R1 is connected to cooling medium collection pipe 3 by a first connecting pipe 15 included in cooling medium path 10. As the cooling medium flows through first flow path R1, first heat generation device 40 is cooled.

An outlet of first flow path R1 is provided at a first end (upper end) of heat conductive member 31A. On the other hand, the first end of heat conductive member 31A is located below cooling medium collection pipe 3. First connecting pipe 15 is thus provided to extend upward.

A fourth flow path R4, through which the cooling medium flows, is provided in heat conductive member 33A. Fourth flow path R4 forms a part of flow path 11 as in the above manner and is located upstream of first flow path R1. Fourth flow path R4 is connected to a fifth flow path R5 (see FIG. 3) of unit 50A, which will be described below, by a third connecting pipe 17 included in cooling medium path 10.

An inlet of fourth flow path R4 is provided at a first end (upper end) of heat conductive member 33A. On the other hand, unit 50A is located below the first end of heat conductive member 33A. Third connecting pipe 17 thus includes a portion extending upward.

Heat conductive member 32A (second heat conductive member) is fixed to second surface 35b of holding member 35A by a fastening member or the like. Heat conductive member 32A is held by holding member 35A so as to cross holding member 35A. Specifically, heat conductive member 32A is held to be orthogonal to holding member 35A.

Heat conductive member 32A has a first end 32c, which is located on the cooling medium collection pipe 3 side relative to holding member 35A, and a second end 32d, which is located opposite to the side on which cooling medium collection pipe 3 is located relative to holding member 35A. Heat conductive member 32A has a first surface 32a and a second surface 32b, which are the front and rear in the DR3 direction.

A second flow path R2, through which the cooling medium flows, is provided in heat conductive member 32A. Second flow path R2 forms a part of cooling medium path 10 (more specifically, flow path 13). Second flow path R2 has an inlet and an outlet on the first end 32c side of heat conductive member 32A.

The outlet of second flow path R2 is connected to cooling medium collection pipe 3. The inlet of second flow path R2 is connected to a third flow path R3 (see FIG. 3) of unit 50A by second connecting pipe 16 included in cooling medium path 10. Unit 50A is located below first end 32c of heat conductive member 32A. Thus, second connecting pipe 16 is mainly provided to extend upward.

Units 50A are fixed to heat conductive member 32A. Units 50A are disposed side by side in the up-down direction. Units 50A are fixed to heat conductive member 32A opposite to the side on which second unit 22 is located. In other words, units 50A are disposed below holding member 35A.

As shown in FIGS. 2 and 3, unit 50A is retained between a plate 91 and a plate 92 to be fixed to heat conductive member 32A. Specifically, plate 91 is located on the first surface 32a side of heat conductive member 32A. Plate 92 is disposed on the second surface 32b side of heat conductive member 32A. Plate 91 and plate 92 are fastened by fastening members while retaining therebetween heat conductive member 32A and retaining unit 50A disposed to contact first surface 32a. Preferably, plate 91 and plate 92 have heat dissipation performance.

Unit 50A is, for example, a reactor unit. Unit 50A includes a heat generation portion 51, a first outer member 52, a second outer member 53, and a base portion 54.

Heat generation portion 51 is, for example, a coil. Heat generation portion 51 is disposed between first outer member 52 and second outer member 53. First outer member 52 and second outer member 53 are disposed on the opposite sides of heat generation portion 51 in the DR2 direction.

Fifth flow path R5 through which the cooling medium for cooling unit 50A flows is formed in second outer member 53. Fifth flow path R5 forms a part of path 11 of cooling medium path 10 and is located upstream of fourth flow path R4.

Base portion 54 is disposed between second outer member 53 and heat conductive member 32A. Base portion 54 functions as a platform to which second outer member 53 is fixed. Third flow path R3 through which the cooling medium for cooling unit 50A flows is formed in base portion 54. Third flow path R3 forms a part of flow path 13 of cooling medium path 10.

Although the case in which unit 50A is a rector is illustrated, the present disclosure is not limited thereto. Unit 50A may be, for example, a semiconductor device, a resistor, a circuit board, or the like.

First support tool 60A is provided in power conversion module 20. First support tool 60A supports first connecting pipe 15.

First support tool 60A is fixed to holding member 35A so as to retain holding member 35A therein. This eliminates the need for separately providing the structure for attaching first support tool 60A to holding member 35A. This simplifies the configuration of holding member 35A and facilitates attachment of first support tool 60A to holding member 35A. A detailed structure of first support tool 60A will be described below with reference to FIG. 4.

Second support tool 70 is provided in power conversion module 20. Second support tool 70 supports second connecting pipe 16 and third connecting pipe 17.

Second support tool 70 is fixed to holding member 35A so as to retain holding member 35A therein. This eliminates the need for providing the structure for separately attaching second support tool 70 to holding member 35A. This simplifies the configuration of holding member 35A and facilitates attachment of second support tool 70 to holding member 35A. A detailed structure of second support tool 70 will be described below with reference to FIG. 5.

Figure 4:
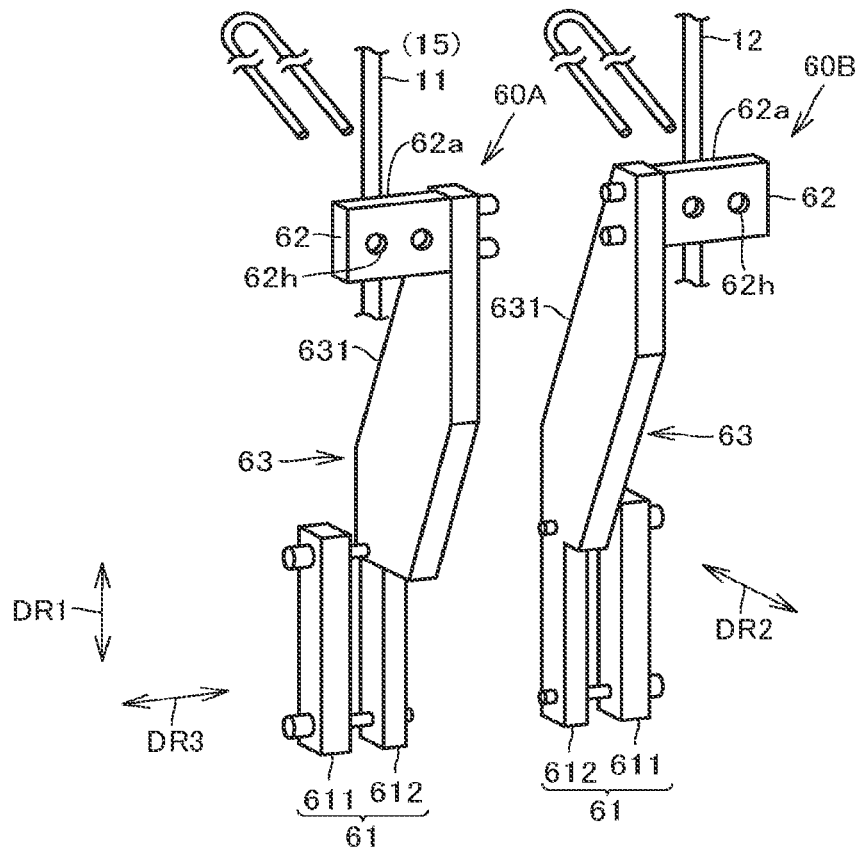
FIG. 4 is an exploded perspective view of a first support tool according to Embodiment 1.

FIG. 4 is an exploded perspective view of the first support tool according to Embodiment 1. Although FIG. 4 shows both of first support tool 60A on the first unit 21 side and first support tool 60B on the second unit 22 side, the configuration of first support tool 60B is substantially similar to the configuration of first support tool 60A. Thus, only the configuration of first support tool 60A will be described, and the description on first support tool 60B will be omitted.

As shown in FIG. 4, first support tool 60A includes a retaining portion 61, a support portion 62, and a connecting portion 63.

Retaining portion 61 is a portion for retaining holding member 35A therein. Retaining portion 61 includes a first member 611 and a second member 612. First member 611 and second member 612 are provided to extend in the DR1 direction and are disposed side by side in the DR3 direction.

As shown in FIGS. 2 and 4, first member 611 and second member 612 are fastened by fastening members while retaining holding member 35A therebetween in the DR3 direction. As a result, first support tool 60A is fixed to holding member 35A so as to retain holding member 35A therein.

First member 611 and second member 612 retain holding member 35A therebetween on the outer side (rear side) of heat conductive member 31A in the DR2 direction. Thus, only holding member 35A can be held without overlapping heat conductive member 31A. This leads to a smaller space in which retaining portion 61 is installed.

Support portion 62 is a portion for supporting first connecting pipe 15. Support portion 62 is disposed at a position closer to first connecting pipe 15 than retaining portion 61 is to first connecting pipe 15. More specifically, support portion 62 is disposed on a first side (front side) in the DR2 direction relative to retaining portion 61.

Support portion 62 has an installation surface 62a for supporting first connecting pipe 15. Installation surface 62a faces first connecting pipe 15 in the direction orthogonal to the axial direction of first connecting pipe 15.

A pair of holes 62h are provided in installation surface 62a. The pair of holes 62h are provided such that first connecting pipe 15 is positioned therebetween. A binding member, such as INSULOK®, is inserted into the pair of holes 62h to be bound, so that first connecting pipe 15 is supported on installation surface 62a.

Mounting surface 62a is directed to a second side (rear side) of power conversion module 20 in the DR2 direction. This facilitates access to installation surface 62a from the rear side, thus allowing a worker to easily fix first connecting pipe 15 to installation surface 62a.

Connecting portion 63 is a portion connecting retaining portion 61 with support portion 62. Connecting portion 63 has an inclined portion 631, which is inclined so as to approach cooling medium collection pipe 3 in the DR1 direction as inclined portion 631 approaches the heat conductive member 31A side in the DR2 direction. This reduces the size of connecting portion 63, leading to effective use of the space in power conversion module 20.

Figure 5:
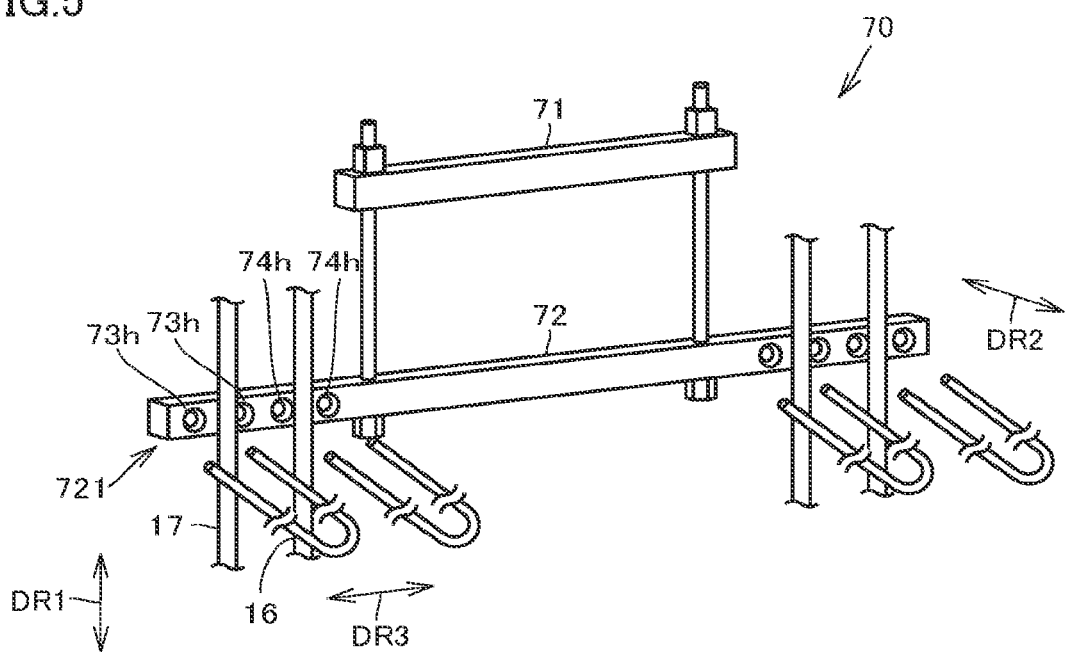
FIG. 5 is an exploded perspective view of a second support tool according to Embodiment 1.

FIG. 5 is an exploded perspective view of a second support tool according to Embodiment 1. Second support tool 70 will be described with reference to FIG. 5.

As shown in FIGS. 2 and 5, second support tool 70 has a first rod-shaped portion 71 and a second rod-shaped portion 72 that retain holding member 35A therebetween from the first end side and the second end side of heat conductive member 32A. In other words, first rod-shaped portion 71 and second rod-shaped portion 72 retain holding member 35A therebetween in the DR1 direction.

First rod-shaped portion 71 and second rod-shaped portion 72 extend in the DR3 direction. First rod-shaped portion 71 is located on a first side (upper side) in the DR1 direction, and second rod-shaped portion 72 is located on a second side (lower side) in the DR1 direction.

Second rod-shaped portion 72 has projections 721 projecting from holding member 35A in the DR3 direction. Two sets of a pair of holes 73h and a pair of holes 74h are provided in projections 721. The respective holes of the pair of holes 73h and the pair of holes 74h are arranged at intervals in the DR3 direction.

The pair of holes 73h are provided to allow third connecting pipe 17 to be positioned therebetween. A binding member such as INSULOK® is inserted into the pair of holes 73h to be bound, so that third connecting pipe 17 is supported by second rod-shaped portion 72.

The pair of holes 74h are provided to allow second connecting pipe 16 to be positioned therebetween. A binding member such as INSULOK® is inserted into the pair of holes 74h to be bound, so that second connecting pipe 16 is supported by second rod-shaped portion 72.

Although the case in which the pair of holes 73h and the pair of holes 74h are provided in second rod-shaped portion 72 and third connecting pipe 17 and second connecting pipe 16 are supported by second rod-shaped portion 72 has been illustrated, the present disclosure is not limited thereto. The pair of holes 73h and the pair of holes 74h may be provided in first rod-shaped portion 71, and third connecting pipe 17 and second connecting pipe 16 may be supported by first rod-shaped portion 71.

As described above, in the power converter according to Embodiment 1, first connecting pipe 15 connecting heat conductive member 31A with cooling medium collection pipe 3 is supported by first support tool 60A. This can reduce vibrations of first connecting pipe 15 even when the cooling medium flows through first connecting pipe 15. Power converter 1 according to Embodiment 1 can thus reduce damage to cooling medium path 10.

Similarly, second connecting pipe 16 and third connecting pipe 17 are also supported by second support tool 70. This can reduce vibrations of first connecting pipe 15 even when the cooling medium flows through second connecting pipe 16 and third connecting pipe 17. Power converter 1 according to Embodiment 1 can thus also reduce damage to cooling medium path 10.

Embodiment 2

Figure 6:
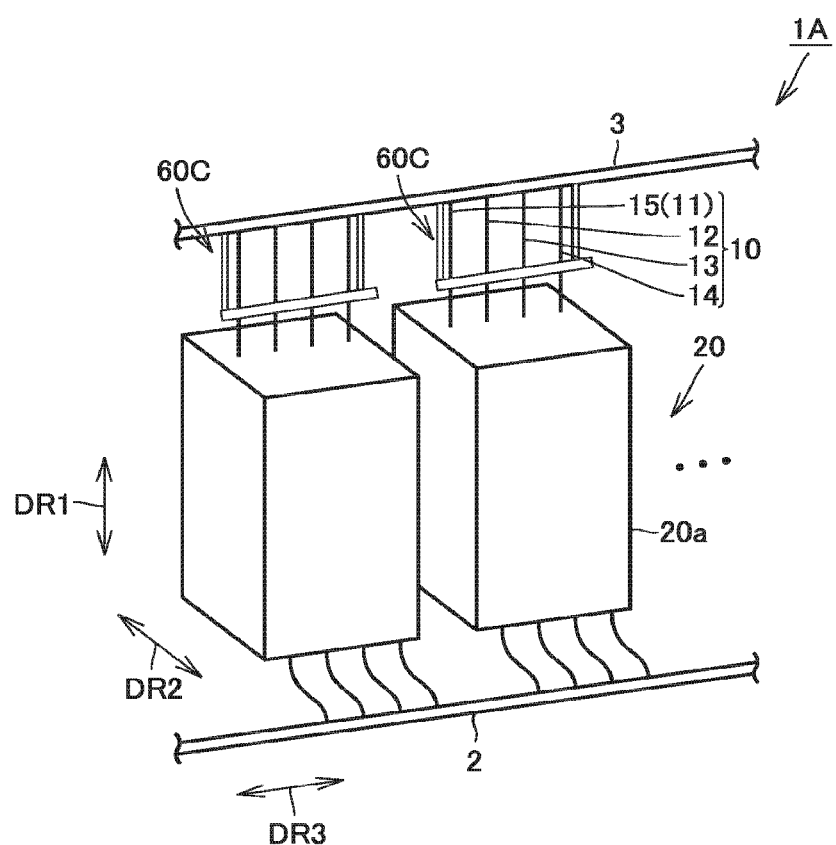
FIG. 6 is a schematic perspective view of a power converter according to Embodiment 2.

FIG. 6 is a schematic perspective view of a power converter according to Embodiment 2. A power converter 1A according to Embodiment 2 will be described with reference to FIG. 6.

As shown in FIG. 6, power converter 1A according to Embodiment 2 differs from power converter 1 according to Embodiment 1 in that a first support tool 60C is provided in cooling medium collection pipe 3.

First support tool 60C supports cooling medium path 10 of a portion extending from housing 20a of power conversion module 20 toward cooling medium collection pipe 3. Cooling medium path 10 of the portion extending from housing 20a to cooling medium collection pipe 3 includes first connecting pipe 15 connecting first flow path provided in the first heat conductive member with cooling medium collection pipe 3 as in Embodiment 1. First support tool 60C is provided to support at least first connecting pipe 15.

Power converter 1A according to Embodiment 2, which is configured as described above, also has effects substantially similar to those of power converter 1 according to Embodiment 1.

The embodiments disclosed herein are illustrative and non-restrictive in every respect. The scope of the present invention is defined by the terms of the claims and is intended to include any modifications within the meaning and scope equivalent to the terms of the claims.

REFERENCE SIGNS LIST 1, 1A power converter; 2 cooling medium supply pipe; 3 cooling medium collection pipe; 10 cooling medium path; 11, 12, 13, 14 path; 15 first connecting pipe; 16 second connecting pipe; 17 third connecting pipe; 20 power conversion module; 20a housing; 21 first unit; 22 second unit; 31A, 31B, 32A, 33A, 33B heat conductive member; 32a first surface; 32b second surface; 32c first end; 32d second end; 35A holding member; 35a first surface; 35b second surface; 40 first heat generation device; 50A, 50B unit; 51 heat generation portion; 52 first outer member; 53 second outer member; 54 base portion; 60A, 60B, 60C first support tool; 61 retaining portion; 62 support portion; 62a installation surface; 62h hole; 63 connecting portion; 70 second support tool; 71 first rod-shaped portion; 72 second rod-shaped portion; 73h, 74h hole; 91, 92 plate; 611 first member; 612 second member; 631 inclined portion; 721 projection.

The invention claimed is:

1. A power converter comprising:
a power conversion module including at least one heat generation device;
a cooling medium path through which a cooling medium for cooling the at least one heat generation device flows;
a cooling medium collection unit disposed outside the power conversion module and collecting the cooling medium that has cooled the at least one heat generation device; and
the power conversion module including a first heat conductive member in which a first flow path forming a part of the cooling medium path is provided,
the cooling medium path including a first connecting pipe connecting the first flow path provided in the first heat conductive member with the cooling medium collection unit, a first support tool provided in at least one of the cooling medium collection unit and the power conversion module and supporting the first connecting pipe, the power conversion module includes a housing and the first support tool is disposed inside the housing, wherein the first support tool is provided in the power conversion module, the power conversion module includes a holding member holding the first heat conductive member, and the first support tool is fixed to the holding member so as to retain the holding member therein, and wherein the first heat conductive member extends in a first direction and has a first end on a first side in the first direction on which the cooling medium collection unit is located, the holding member extends in a second direction intersecting the first direction, the first connecting pipe is routed to extend from a first end side toward the cooling medium collection unit, the first support tool includes
- a retaining portion retaining the holding member therein outside the first heat conductive member in the second direction,
- a support portion supporting the first connecting pipe on a side on which the cooling medium collection unit is located relative to the retaining portion, and
- a connecting portion connecting the support portion with the retaining portion, and the connecting portion has an inclined portion inclined to approach the cooling medium collection unit in the first direction as the inclined portion approaches a first heat conductive member side in the second direction.

2. A power converter comprising:

a power conversion module including at least one heat generation device;

a cooling medium path through which a cooling medium for cooling the at least one heat generation device flows;

a cooling medium collection unit disposed outside the power conversion module and collecting the cooling medium that has cooled the at least one heat generation device; and
- the power conversion module including a first heat conductive member in which a first flow path forming a part of the cooling medium path is provided,
- the cooling medium path including a first connecting pipe connecting the first flow path provided in the first heat conductive member with the cooling medium collection unit, a first support tool provided in at least one of the cooling medium collection unit and the power conversion module and supporting the first connecting pipe, the power conversion module includes a housing and the first support tool is disposed inside the housing, wherein the first support tool is provided in the power conversion module, the power conversion module includes a holding member holding the first heat conductive member, and the first support tool is fixed to the holding member so as to retain the holding member therein, wherein the power conversion module includes a second heat conductive member in which a second flow path forming a part of the cooling medium path is provided, the at least one heat generation device includes a unit which has a heat generation portion and in which a third flow path forming a part of the cooling medium path is provided, the second heat conductive member is held by the holding member so as to intersect the holding member, the second heat conductive member has
- a first end located on a side on which the cooling medium collection unit is located relative to the holding member, and
- a second end located opposite to the side on which the cooling medium collection unit is located relative to the holding member, the unit is fixed to the second heat conductive member to be located on a second end side of the second heat conductive member relative to the holding member, the cooling medium path includes a second connecting pipe connecting the second flow path with the third flow path, the second connecting pipe connects the unit with a first end side of the second heat conductive member so as to cross the holding member, and the power converter further comprises a second support tool fixed to the holding member so as to retain the holding member therein and supporting the second connecting pipe.

3. The power converter according to claim 2, wherein the second support tool has a first rod-shaped portion and a second rod-shaped portion retaining the holding member therebetween from the first end side and the second end side of the second heat conductive member, and the second connecting pipe is supported by at least one of the first rod-shaped portion and the second rod-shaped portion.

* * * * *